United States Patent [19]

Lueft

[11] Patent Number: 5,223,111
[45] Date of Patent: Jun. 29, 1993

[54] DEVICE FOR APPLYING THIN LAYERS ONTO A SUBSTRATE

[75] Inventor: Gerold Lueft, Gelnhausen, Fed. Rep. of Germany

[73] Assignee: Leybold Aktiengesellschaft, Hanau, Fed. Rep. of Germany

[21] Appl. No.: 521,266

[22] Filed: May 9, 1990

[30] Foreign Application Priority Data

Mar. 1, 1990 [DE] Fed. Rep. of Germany ....... 4006411

[51] Int. Cl.⁵ ............................................ C23C 14/34
[52] U.S. Cl. ........................... 204/298.07; 204/298.09; 204/298.11; 204/298.14
[58] Field of Search ...................... 204/298.07, 298.09, 204/298.11, 298.14, 298.23, 192.12

[56] References Cited

U.S. PATENT DOCUMENTS

| | | | |
|---|---|---|---|
| 4,412,906 | 11/1983 | Sato et al. | 204/298.07 |
| 4,425,218 | 1/1984 | Robinson | 204/298.07 |
| 4,572,842 | 2/1986 | Dietrich et al. | 204/298.07 X |
| 4,849,087 | 7/1989 | Meyer | 204/298.07 X |
| 4,946,576 | 8/1990 | Dietrich et al. | 204/298.07 X |

FOREIGN PATENT DOCUMENTS 3521053 12/1986 Fed. Rep. of Germany.

Primary Examiner—Nam X. Nguyen
Attorney, Agent, or Firm—Felfe & Lynch

[57] ABSTRACT

One piece hollow members 6, 7 supported at the wall of the vacuum chamber 1 are provided parallel to the plane of the cathode 12 and in the area between the cathode 12 and the anode 4, 5. These members have axis-parallel conduits 6a, 6b, 6d, 7a, 7b, 7d passed through by both the temperature-regulating medium and the process gas. The hollow members 6, 7 have openings 6e, 6e', ..., 7e, 7e', ... which run transversely to the longitudinal axis of the conduits for the process gas to emerge into the vacuum chamber 1.

9 Claims, 3 Drawing Sheets

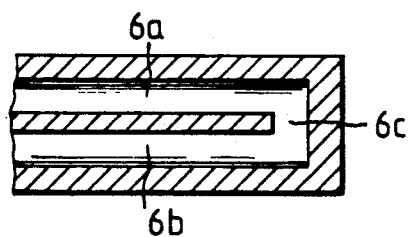
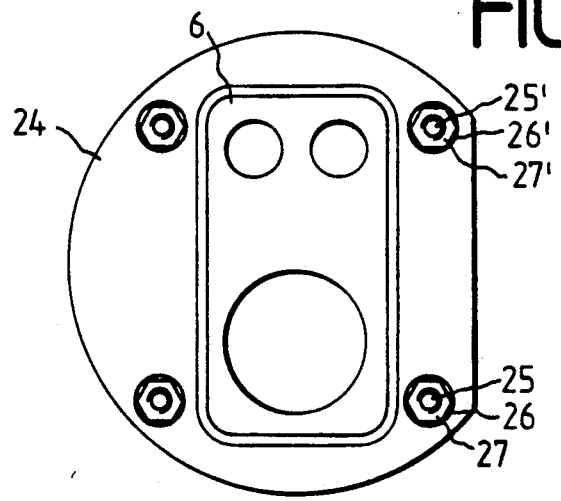
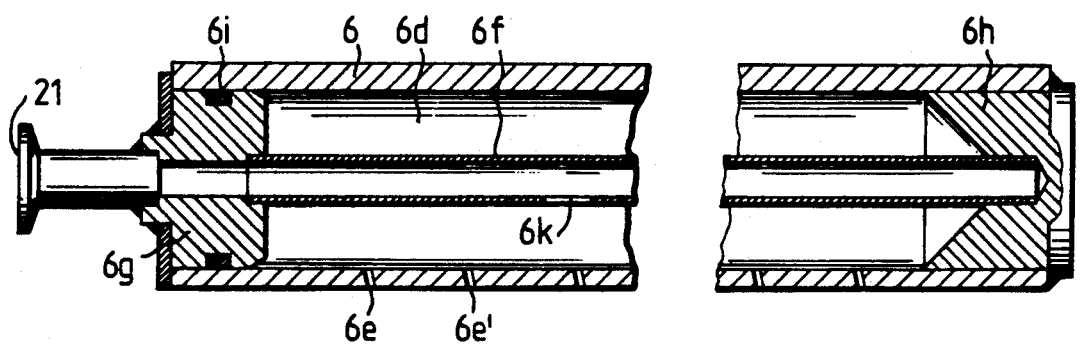

in the vacuum chamber 1

DEVICE FOR APPLYING THIN LAYERS ONTO A SUBSTRATE

BACKGROUND OF THE INVENTION

The invention relates to a device for applying thin layers onto a substrate by means of cathode sputtering in a vacuum chamber. The substrate to be coated can be moved across this chamber in which a diaphragm is disposed between the cathode to be sputtered and the anode. Hollow members having conduits are provided parallel to the cathode plane and in the area between the cathode and the anode and held by the wall of the vacuum chamber. They are passed through by a temperature-regulating medium and by a process gas. The conduits are provided with openings for the process gas which run transversely to the longitudinal axis of this conduit and permit the process to emerge into the vacuum chamber.

A device is known for applying thin layers onto a substrate by means of cathode sputtering (EP 0 205 028, to which U.S. Pat. No. 4,946,576 correspond). Here, a mechanical diaphragm is provided between the cathode to sputtered and the anode separating the space between the cathode and the substrate to be sputtered. This device has several separate cooling pipes and gas pipes for the supply of temperature-regulating medium and process gas.

It is a disadvantage of this known device that separate, multi-piece pipe lines must be used for the feeding and return of temperature-regulating medium as well as for the supply of process gas. The device is thus susceptible to failures and its manufacture and maintenance involves a great amount of labor and cost. The pipe lines exhibit bends, windings, screwed connections and soldering joints which, under operating conditions of the device, are inside a vacuum. This leads to hair cracks and leaks in the pipe lines caused by the additional effect of process heat. These leaks negatively affect the layer quality, for example, the adhesiveness of the layer to be applied onto the substrate during the sputtering and the consequence is a subsequent total failure of the entire system which always involves a significant amount of labor and immense costs.

SUMMARY OF THE INVENTION

It is therefore an object of the invention to improve the device in such a way that the operational safety is considerably improved and the failure times reduced and manufacture and maintenance are significantly simplified, which in turn leads to a substantial reduction of the manufacturing and maintenance costs.

This object is accomplished in that both the temperature-regulating medium as well as the process gas are guided in conduits. These conduits are formed from a one-piece component which is formed as a hollow member and has openings for the gas to emerge which run transversely to the longitudinal axis of the conduits.

The device has a hollow member which is characterized by a rectangular area of cross section with bevelled corners.

The device has a hollow member having a rectangular cross section with bevelled corners. Advantageously, this member is simple to manufacture, has distinct and easily accessible contact points, and permits connecting temperature-regulating medium and process gas outside the vacuum chamber.

BRIEF DESCRIPTION OF THE DRAWINGS

FIG. 3 is a cross section of the right, free end piece of the hollow member including the conduits for the temperature-regulating medium; as compared to FIG. 2, this representation is rotated by 90°, FIG. 4 is a side view in a reduced size showing the mounting flange of FIG. 2 and FIG. 5 is an enlarged cross section of a conduit for process gas including two reducer pieces and a gas distributing pipe.

DETAILED DESCRIPTION OF THE PREFERRED EMBODIMENT

Figure 1:
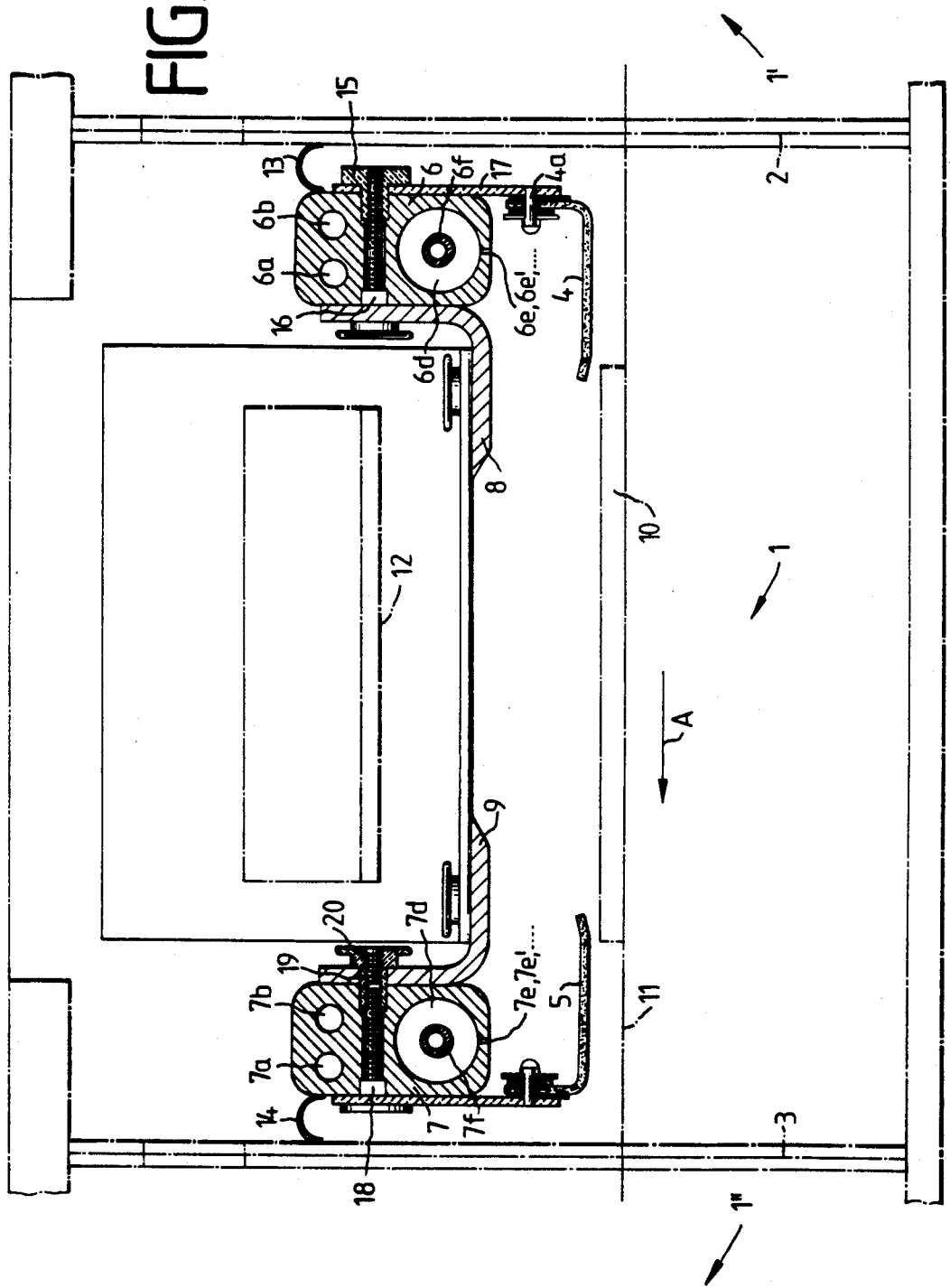
FIG. 1 is a cross sectional view of a part of the device which shows a part of the vacuum chamber, the substrate and the cathode in a dot-dash line.

As shown in FIG. 1, additional vacuum chambers 1', 1'' are added to the side of the rectangular vacuum chamber 1. These additional chambers are connected to each other in one line by means of locks 2, 3.

In a vacuum chamber 1, the anodes 4, 5 are disposed parallel to one another and transversely to the direction of extension of the chambers 1, 1', 1''. The disposal is such that the rectangular hollow members 6, 7 and the diaphragms 8, 9 follow toward the center of the chamber. Conduits 6a, 7a for the feeding of the temperature-regulating medium (coolant) and conduits 6b, 7b for the return thereof are located above conduits 6d, 7d for the process gas in the centers of which the gas distributing pipes 6f, 7f are mounted. Moreover, on their bottom sides, the conduits for the process gas 6d, 7d, ... are provided with regularly spaced-apart openings 6e, 6e', ..., 7e, 7e', ... for the process gas to emerge from conduits 6d, 7d into the vacuum chamber 1. Underneath the anodes 4, the substrate 10 can be moved across the vacuum chamber in direction A on a horizontally extending substrate plane 11.

Cathode 12 is above and between the diaphragms 8, 9 and extends parallel to the hollow members 6, 7 and hence transversely to the direction of moving A of the substrate.

The two U-like sealing/baffle plates 13, 14 are disposed such that they close the gap which remains between the hollow members 6, 7 and the chamber walls of the vacuum chamber 1.

By means of screw 16, the insulating bush 15 fixes the insulating ledge 17 to which the anode 4 is attached via clamping device 4a in its position to the hollow member 6. Screw 18 connects the hollow member 7 to the diaphragm 9 via arresting bush 19 and clamping screw 20.

At the front side, the flange for the process gas 21 and the screwed connection for the temperature-regulating medium 22 are mounted to the one end of the hollow member 6 which protrudes from the vacuum chamber 1. The flange for the process gas 21 is welded to the reducer piece 6g and together with the sealing ring 6i, it seals the conduit for the process gas 6d. Together with the sealing ring 6l, the screwed connection for the temperature-regulating medium 22 seals the conduit for the temperature-regulating medium 6a, 6b (FIG. 2).

The intermediate flange 23, the end flange 24, the threaded bolts 25, 25', ..., the disks 26, 26', ... and the nuts 27, 27', ... fix the hollow member in its position in the vacuum chamber 1. The vacuum sealing rings 28, 29 seal this hollow member with respect to atmospheric pressure (FIG. 2).

The connecting conduit 6c connects conduit 6a for the supply of temperature-regulating medium to the return conduit 6b (FIG. 3).

Figure 2:
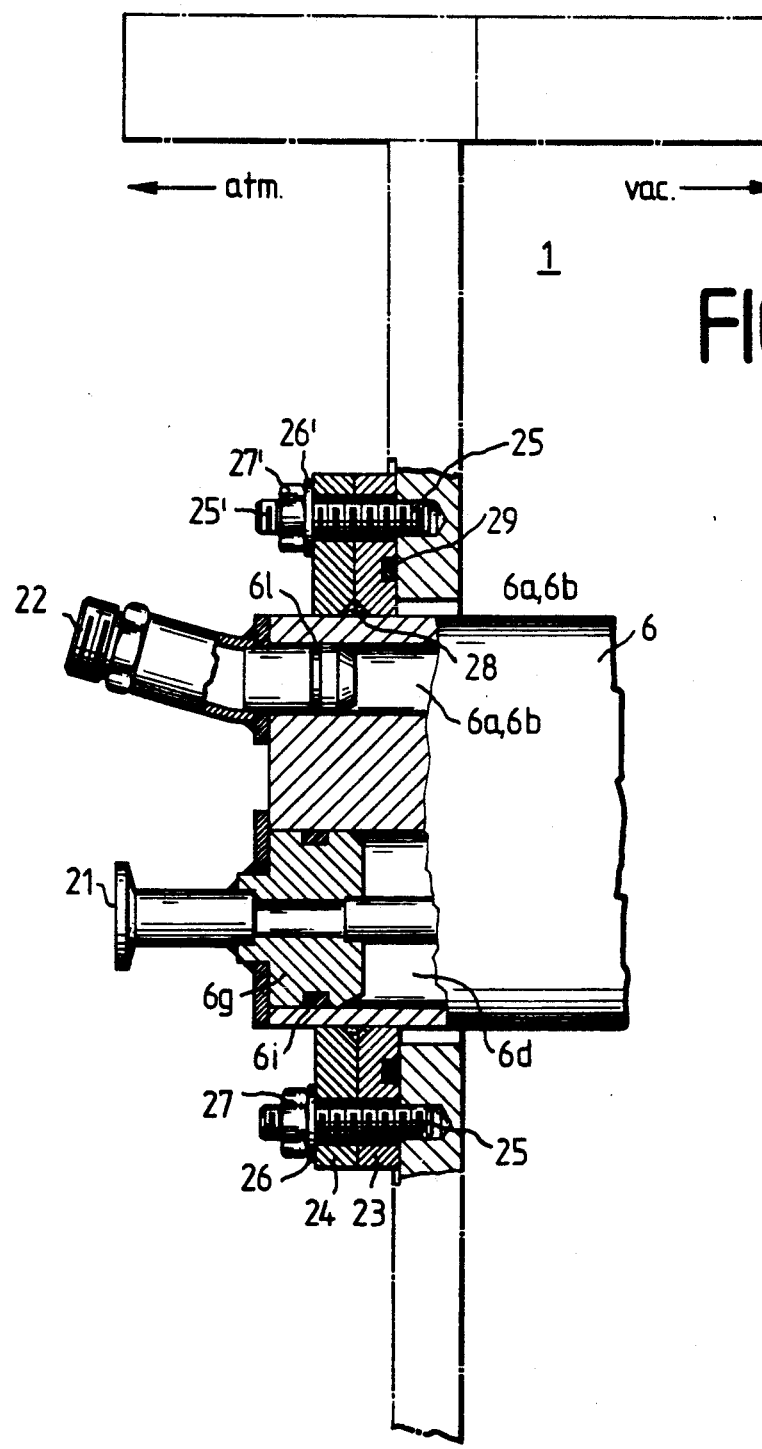
FIG. 2 is an enlarged side view of the left end piece of the hollow member of FIG. 1 inclusive of the flange mounting at the vacuum chamber wherein the wall of the vacuum chamber is shown in a dot-dash line.

The threaded bolts 25, 25', . . . , the disks 26, 26', . . . , and the nuts 27, 27', . . . , which are symmetrically arranged on a partial circle arrest the end flange 24 in its position thus centering the rectangular hollow member 6 in its position at the wall of the vacuum chamber shown in FIG. 2 (FIG. 4).

Referring to FIG. 5, the gas distributing pipe 6f has an opening 6k in the center of its axial extension for evenly distributing the process gas in the conduit 6d. This gas distributing pipe is disposed such that it is centered and axially fixed in its position by means of the reducer pieces 6g, 6h. Together with the sealing ring 6i, it seals the gas conduit toward the hollow member 6. The flange 21 for the process gas is welded to the reducer piece 6g. On its bottom side, the conduit for the process gas 6d is provided with regularly spaced-apart openings 6e, 6e', . . . for the process gas to emerge from conduit 6d into the vacuum chamber already shown in FIG. 1.

I claim:

1. Apparatus for applying thin layers on a substrate by means of cathode sputtering, comprising
   a vacuum chamber having a wall with an opening therethrough,
   a cathode to be sputtered in said chamber,
   an anode opposite said cathode in said chamber,
   a diaphragm between said cathode and said anode, and
   a one-piece linear conduit member in said chamber and having at least one conduit therein for coolant, at least one conduit therein for process gas, and a plurality of openings therein between said conduit for process gas and said chamber, said conduit member passing through said opening in said wall,
   flange means fixing said member to said wall at said opening,
   sealing means between said flange means and said member, and between said flange means and said wall, and
   connection means for providing coolant and process gas to respective conduits, said connection means being provided outside of said vacuum chamber.

2. Apparatus as in claim 1 wherein said conduit member has a rectangular cross section with bevelled edges.

3. Apparatus as in claim 1 wherein said one-piece conduit member has a conduit therein for supplying coolant, a conduit therein for returning coolant, and a conduit for process gas, said conduits all being mutually parallel in said member.

4. Apparatus as in claim 3 wherein said conduits for supplying and returning coolant have identical cross sections.

5. Apparatus as in claim 3 wherein said conduit for process gas has a larger cross section than either of said conduit for supplying coolant and said conduit for returning coolant.

6. Apparatus as in claim 1 further comprising a gas distributing pipe disposed in said conduit for process gas.

7. Apparatus as in claim 6 wherein said gas distributing pipe has a lateral opening.

8. Apparatus as in claim 1 wherein said openings are spaced apart at regular intervals.

9. Apparatus as in claim 1 wherein said conduit member is spaced from said wall by a baffle which prevents flow of process gas between said member and said wall.

* * * * *